United States Patent
Wagner

(10) Patent No.: US 6,828,500 B2
(45) Date of Patent: Dec. 7, 2004

(54) VENTILATING BATTERY COVER

(75) Inventor: Josef Wagner, Lachen (CH)

(73) Assignee: Phonak AG, Stafa (CH)

( * ) Notice: Subject to any disclaimer, the term of this patent is extended or adjusted under 35 U.S.C. 154(b) by 0 days.

(21) Appl. No.: 10/347,738

(22) Filed: Jan. 21, 2003

(65) Prior Publication Data
US 2004/0140114 A1 Jul. 22, 2004

(51) Int. Cl.⁷ .................................................. H05K 5/00
(52) U.S. Cl. .................. 174/17 VA; 174/50; 174/17 R; 220/4.02
(58) Field of Search .................... 174/50, 17 R, 174/17 VA, 16.1, 66, 67; 220/3.2, 3.3, 3.6, 3.8, 4.02, 4.01; 454/184; 381/325, 328, 322, 312; 181/135

(56) References Cited

U.S. PATENT DOCUMENTS

| | | | | |
|---|---|---|---|---|
| 2,791,168 A | * | 5/1957 | Mauch | ........................ 454/370 |
| 4,547,438 A | * | 10/1985 | McArthur et al. | ............. 429/82 |
| 4,889,542 A | * | 12/1989 | Hayes | ........................ 174/16.1 |
| 4,987,597 A | | 1/1991 | Haertl | |
| 5,187,746 A | | 2/1993 | Narisawa | |
| 5,573,562 A | * | 11/1996 | Schauwecker et al. | ...... 454/184 |
| 6,041,128 A | | 3/2000 | Araki et al. | |
| 6,095,356 A | * | 8/2000 | Rits | ............................ 422/101 |
| 6,506,110 B1 | * | 1/2003 | Borisch | ................... 174/17 VA |
| 6,671,381 B1 | * | 12/2003 | Lux-Wellenhof | ............ 381/325 |

FOREIGN PATENT DOCUMENTS

| | | |
|---|---|---|
| FR | 2 785 0928 | 4/2000 |
| WO | 98 47191 A | 10/1998 |

OTHER PUBLICATIONS

Patent Abstracts of Japan vol. 004, No. 133 (E–026), Sep. 18, 1980 & JP 55 086073 A (Zeniraito V:KK), Jun. 28, 1980.

* cited by examiner

Primary Examiner—Dean A. Reichard
Assistant Examiner—Angel R. Estrada
(74) Attorney, Agent, or Firm—Pearne & Gordon LLP

(57) ABSTRACT

At least one side wall area of a casing, suitable for small electronic devices such as hearing aid devices e.g. for the use in environment with elevated humidity, is proposed to be porous or perforated. On the outside surface of the casing a fleece is arranged on the said side wall area, which fleece does have a higher porosity or pores with a smaller diameter respectively than the pores or openings within the said side wall area of the casing. The side wall area can be e.g. a cover or lid respectively, which is covered on its outer surface with the said fleece. The fleece preferably is a "non-woven" consisting of polymer fibers such as e.g. polyester fibers. The casing cover or lid respectively can be e.g. a cover of a receptacle for batteries.

6 Claims, 1 Drawing Sheet

VENTILATING BATTERY COVER

FIELD OF THE INVENTION

This invention relates to a housing for electronic microdevices as specified in the characterizing clause of claim 1, and to a battery cover for electronic microdevices.

BACKGROUND OF THE INVENTION

One relatively frequent problem encountered these days in electronic microdevices such as hearing aids is battery corrosion in the battery compartment. Apart from the unattractive appearance of deposits that accumulate in the housing, such corrosion can progressively destroy the device. The majority of users, however, are bothered most of all by the unsightly deposits that form on the battery and in the housing. This problem becomes particularly conspicuous when such microdevices, for instance hearing aids, are subjected to a perspiration test.

There have been a variety of approaches in an attempt to bring this corrosion problem under control especially in the case of hearing aids. One such attempt has been to seal the housing as airtight as possible or to improve the situation in the device by installing a siccative. Other approaches have placed the emphasis on regular care of the device or on overcoming the problem by storing the devices in desiccating boxes. Prior art has described and documented the most diverse approaches and solutions to the problem.

Significantly, however, the use of siccatives or storage in dry chambers can only be a temporary solution since siccatives are spent after a certain time while storage in a dry place usually precludes the actual use of the device.

SUMMARY OF THE INVENTION

One objective of this invention is therefore to introduce a solution to the problem described above, i.e. a solution to the corrosion problem, that allows electronic microdevices to be used even in a moist environment while preventing for instance hearing aids from being destroyed by perspiration.

According to the invention, this objective is achieved by means of a housing as described in claim 1 and, respectively, by the use of a battery cover for electronic microdevices.

As a proposed solution, the housing for electronic microdevices especially such as hearing aids and others intended for use in an environment of elevated moisture or humidity levels incorporates at least one wall section that is perforated or porous and, facing the outside of the housing, said wall section is provided with a nonwoven fabric or fibrous pad whose pores are smaller in diameter than those of said wall section of the housing.

It is further proposed to taper the perforations or pores of the porous wall section in such fashion that the pore diameter decreases from inside the housing toward the outside.

Finally, it is proposed to additionally provide a retaining feature that holds the fibrous pad against the outside of the wall section. Alternatively, in lieu of such a holder, the fibrous pad can be attached to the wall section for instance by means of a so-called velcro strip or it may be held in place by a double-sided adhesive tape or similar means.

The wall section referred to may for instance be in the form of a housing cover serving to securely close off the electronics inside the housing or a battery compartment in that housing. In other words, said wall section may be a housing cover and in particular a battery cover. Correspondingly, in the case of hearing aids it constitutes the cover of the battery compartment.

The method per this invention, designed to prevent excessive corrosion of the battery for instance in the battery compartment of a hearing aid, utilizes the phenomenon of capillary action. In this case, what used to be a detrimental effect is turned into a positive effect. The capillary action (capillary rise) is known to vary as a function of the diameter or gap width of a capillary structure. If in one and the same material only the gap width is varied, the capillary rise is determined by the surface tension. If in any such combination the diameter and/or gap width is varied, the result will be a surface tension-dependent pressure differential that draws any fluid in the direction of the smaller diameter or gap. These considerations have led to the realization that the liquid or fluid will always move in the direction of the smaller gap. That realization in turn has spawned the underlying idea of this invention whereby the fluid, moisture or perspiration can be drawn, "siphoned off" as it were, into very small capillaries. Accordingly, this invention proposes to mount a fibrous pad on a perforated battery cover that serves to draw off the moisture that may enter the device for instance from a switch and to prevent any fluid from penetrating through the battery cover into the device.

One advantage of this solution over others that seal the device in airtight fashion is that it allows for 'breathability' i.e. ventilation which is important especially for the zinc-air batteries common today.

As a result, any moisture that may already have entered the device will dry off more rapidly and over time a quasi-dry normal state will be established.

The positive effect of a battery cover designed according to the invention has been clearly determined in a perspiration test, mentioned above, revealing a distinct difference between it and a battery compartment not equipped with a battery cover per the invention. The housing equipped as provided for by this invention had a clean battery compartment.

By way of an example the following will explain this invention in more detail, with reference to the attached drawings in which:

DETAILED DESCRIPTION OF THE PREFERRED EMBODIMENT

Figure 1:
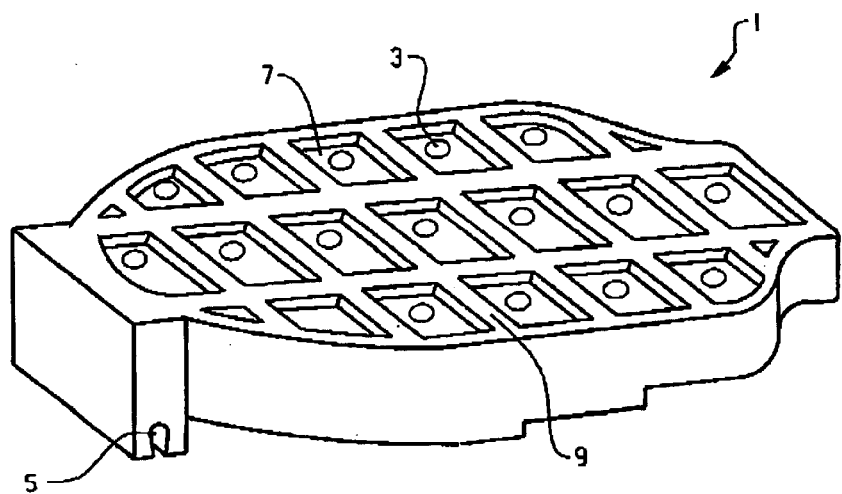
FIG. 1 is a perspective top view of a battery cover designed in accordance with this invention.

The perspective top-view illustration in FIG. 1 shows a cover 1, designed per this invention, for the battery compartment of a hearing aid. The battery cover 1 permits rotation on the hearing-aid housing via a hinge 5. The top i.e. outer surface of the cover 1 is provided with a nonwoven-fabric i.e. fibrous pad 7 that is held in place on the cover 1 by means of a retaining grid 9. As only suggested in FIG. 1 because normally not visible, the cover 1 features capillaries i.e. openings 3 that establish a communicating connection between the interior of the hearing-aid housing and the fibrous pad 7.

Figure 2:
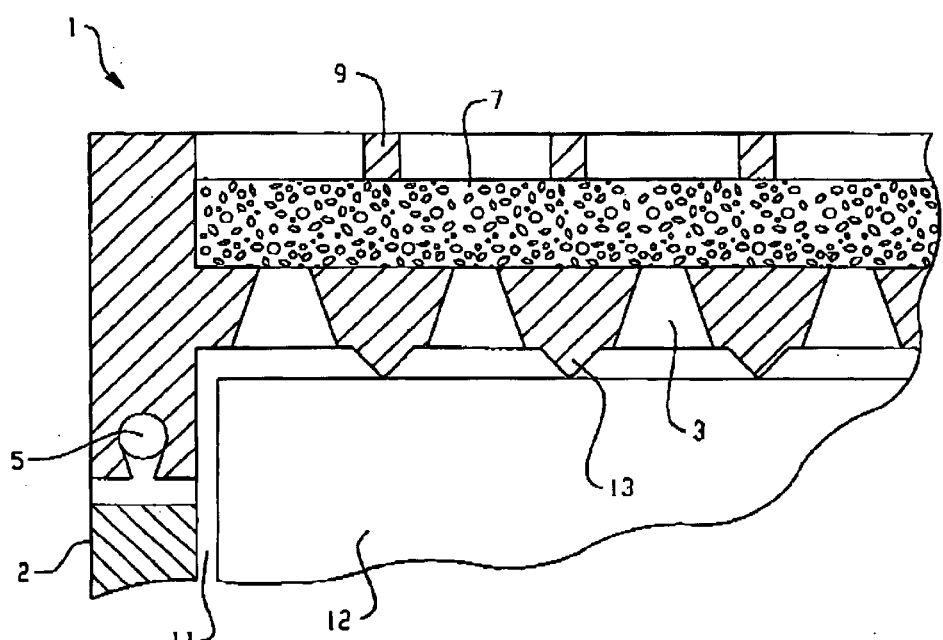
FIG. 2 is a cross-sectional view showing part of a housing with a battery compartment and the battery cover mounted on it.

FIG. 2 is a sectional view of the cover on the housing of a hearing aid. The cover 1 connects to the hearing-aid housing 2 via a hinge 5 while closing off a battery compartment 11 that houses the battery for supplying electric power to the hearing aid. Mounted on top of the porous basic cover 1 with its capillaries 3 is the fibrous pad 7 featuring a microporous structure, i.e. the pores or passages in the pad 7 are considerably smaller in diameter than the capillaries 3 in the cover 1. The pad 7 is held in place on the cover 1 by means of a retaining grid 9.

As can be clearly seen in FIG. 2, the capillaries 3 are cone-shaped, with the diameter of the capillaries 3 decreasing from the interior of the housing i.e. battery compartment toward the fibrous pad. To ensure positionally secure retention of the battery 12 in the battery compartment 11, the cover 1 of the battery compartment is provided on its bottom surface with so-called support points 13.

The battery cover 1 with its fibrous pad, designed according to this invention, makes certain that any moisture present in or penetrating into the battery compartment is drawn off to the outside by virtue of the capillary effect because the capillary or pore diameter tapers off from the battery compartment toward the outside. The reason for this is the above-described principle of the capillary effect which latter is a function of the capillary diameter or gap width.

Of course, the battery compartment cover illustrated in FIGS. 1 and 2 is merely an example serving to explain this invention more clearly. It is entirely possible, of course, to equip any given electronic microdevice with a suitably adapted cover and to flush-mount on the outside of that cover a fibrous pad whose capillaries or pore diameters are smaller than those of the cover which is itself provided with pores or perforations. It is even possible to design any wall section of the housing of an electronic microdevice along the lines of this invention, i.e. to fabricate a porous wall, or wall section, and to flush-mount on its outside a nonwoven-fabric fibrous pad with smaller pores than those of the wall or wall section proper.

While this invention has been described in connection with hearing aids, the concept of this invention is equally applicable to the "dry-keeping" of any electronic microdevice that must be kept "dry" (i.e. free of liquid components) so as to prevent corrosion or the chemical decomposition of electronic components and/or a battery used for the electric power supply. In the case of hearing aids the moisture in question may be primarily perspiration or dermal halitus that can lead to the destruction of electronic components or of the battery.

It should be noted that the invention is independent of the choice of material used for the housing, its cover or its battery-compartment cover, meaning that the material may be any polymer that lends itself to the production of the housing of the electronic microdevice concerned. The nonwoven-fabric fibrous pad as well may be made from a variety of materials, for example polyester fibers that have been commonly used for producing so-called nonwovens.

What is claimed is:

1. An electronic microdevice housing (2) for a hearing aid, for use in an environment with an elevated moisture or relative humidity level, characterized by at least one wall section (1) of the housing (2) further comprises openings (3), and by a non-woven fabric fibrous pad (7) with a microporous structure having pore openings, attached on the outside of said housing wall section (1), wherein the pore opening of the fibrous pad (7) has a smaller diameter than the openings in the wall section (1) and wherein the wall section (1) is the cover (1) of a battery compartment (11).

2. System as in claim 1, characterized in that the openings (3) of the wall section (1) are cone-shaped in such fashion that the opening diameter decreases from the interior of the housing toward the outside.

3. System as in claim 1 or 2, characterized in that it is provided with a retaining device (9), wherein the retaining device is a velcro fastener or a double-sided adhesive strip for holding the fibrous pad (7) in place on the wall section (1).

4. System as in one of the claim 3, characterized in that the fibrous pad is made from a non-woven material consisting of polymer fibers and especially polyester fibers.

5. Method for preventing moisture from entering the interior of an electronic microdevice for a hearing aid comprising the steps of:

providing a housing (2) having at least one wall section (1) further comprising openings (3), wherein the wall section (1) is the cover of a battery compartment (11), a non-woven fabric fibrous pad having pore openings attached to the outside of said housing wall section (1), wherein the pore opening of the fibrous pad (7) has a smaller diameter than the openings (3) in the wall section (1); and, drawing the moisture from inside the housing to the outside due to the capillary effect.

6. The method of claim 5, wherein the drawing of moisture is created by a pressure differential resulting from the difference in surface tension between the openings (3) in the wall section (1) and the pore openings in the fibrous pad (7).

\* \* \* \* \*